(12) United States Patent
Katagiri et al.

(10) Patent No.: US 11,069,563 B2
(45) Date of Patent: Jul. 20, 2021

(54) METHOD FOR PROCESSING SUBSTRATE AND SUBSTRATE PROCESSING APPARATUS

(71) Applicant: EBARA CORPORATION, Tokyo (JP)

(72) Inventors: Atsuo Katagiri, Tokyo (JP); Itsuki Kobata, Tokyo (JP)

(73) Assignee: EBARA CORPORATION, Toyko (JP)

( * ) Notice: Subject to any disclaimer, the term of this patent is extended or adjusted under 35 U.S.C. 154(b) by 0 days.

(21) Appl. No.: 16/814,560

(22) Filed: Mar. 10, 2020

(65) Prior Publication Data

US 2020/0294847 A1   Sep. 17, 2020

(30) Foreign Application Priority Data

Mar. 14, 2019   (JP) .............................. JP2019-047096

(51) Int. Cl.
  *H01L 21/768*    (2006.01)
  *H01L 21/321*    (2006.01)
  *H01L 21/3105*   (2006.01)

(52) U.S. Cl.
  CPC .... *H01L 21/7684* (2013.01); *H01L 21/31055* (2013.01); *H01L 21/32115* (2013.01); *H01L 21/76819* (2013.01)

(58) Field of Classification Search
  CPC ......... H01L 21/31055; H01L 21/76819; H01L 21/7684; H01L 21/32115
  USPC ....................................... 438/746, 754, 756
  See application file for complete search history.

(56) References Cited

U.S. PATENT DOCUMENTS

| 8,673,783 B2* | 3/2014 | Kang ................ H01L 21/28079 438/692 |
| 2010/0075501 A1* | 3/2010 | Abe ........................ C09K 13/06 438/693 |
| 2017/0047237 A1* | 2/2017 | Kobata ............... H01L 21/3212 |

FOREIGN PATENT DOCUMENTS

JP      2008-121099 A    5/2008

OTHER PUBLICATIONS

Wikipedia, "Titanium Nitride" via https://en.wikipedia.org/wiki/Titanium_nitride#:~:text=Titanium%20nitride%20(TiN%3B%20sometimes%20known,improve%20the%20substrate's%20surface%20properties ; pp. 1-6, (Year: 2020).*

* cited by examiner

*Primary Examiner* — Binh X Tran
(74) *Attorney, Agent, or Firm* — BakerHostetler (57) ABSTRACT

Planarization is performed on heterogeneous films with high accuracy. According to one embodiment, a method for processing a substrate is provided. The substrate is formed of an insulating film layer where a groove is formed, a barrier metal layer, and a wiring metal layer in order from a bottom in at least a part of a region. The method includes (3) while the wiring metal layer, the barrier metal layer, and the insulating film layer are exposed to the surface of the substrate: a step of bringing the surface of the substrate into contact with a catalyst; a step of supplying a process liquid between the catalyst and the surface of the substrate; and a step of flowing a current between the catalyst and the surface of the substrate.

14 Claims, 8 Drawing Sheets

METHOD FOR PROCESSING SUBSTRATE AND SUBSTRATE PROCESSING APPARATUS

CROSS-REFERENCE TO RELATED APPLICATION

This application is based upon and claims the benefit of priority of the prior Japanese Patent Application No. 2019-047096, filed on Mar. 14, 2019, the entire content of which is incorporated herein by reference.

TECHNICAL FIELD

This application relates to a method for processing a substrate.

BACKGROUND ART

In manufacturing processes of semiconductor devices, a chemical mechanical polishing (CMP) has been widely used as a technique for processing a surface of a substrate. A CMP apparatus polishes the surface of the substrate by having a polishing head hold the substrate as a process target, pressing the substrate on a polishing pad installed on a polishing table, and causing the polishing head and the polishing table to make relative movement while supplying a slurry between the polishing pad and the substrate.

In association with miniaturization of current semiconductor device structures, a planarization technique with higher accuracy, a processing accuracy in an angstrom order, and a processing technique without any damage have been demanded. The planarization process typified by the CMP is no exception. While a removal amount itself decreases to, for example, around 100 Å, in association with the miniaturization, controllability at an atomic level is required. In order to satisfy this requirement, conditions of polishing and cleaning are optimized in the CMP. However, since the CMP polishes the surface of the substrate using abrasive grains, mechanical damages are likely to be generated on the substrate, and processing without any damage is difficult. Therefore, a catalyst referred etching (CARE) is proposed as a new processing technique. With the CARE technique, a catalyst and a process target are brought into contact in a process liquid with the catalyst defined as a reference surface. As a result, reactive species generated on the surface of the catalyst and the process target substrate cause chemical reaction, and thus, materials of the surface of the substrate are removed.

CITATION LIST

Patent Literature

PTL 1: Japanese Unexamined Patent Application Publication No. 2008-121099

SUMMARY OF INVENTION

Technical Problem

When the CARE method applies to the planarization process of the substrate, two or more kinds of semiconductor materials should be uniformly removed in some cases. The target semiconductor materials include a Low-k material for an oxidized film as an insulating film, W and Cu as a wiring material, and a metallic material, such as TaN and TiN, as a barrier metal. Furthermore, for next-generation materials, new materials, such as ruthenium (Ru) and cobalt (Co) are proposed. It is desired that the planarization is performed on heterogeneous layers including these materials with high accuracy. However, under a situation where these materials are mixed, the planarization is difficult by a single CARE process because each material has a different etching property. Therefore, it is required that a CARE process corresponding to the kind and the state of the material to be exposed.

This disclosure has been made in consideration of the above-described problem, and one object of the disclosure is to provide a planarization process that ensures maintaining a planarization performance in a process by the CARE even under a situation where materials to be exposed are different.

Solution to Problem

According to one embodiment, a method for processing a substrate is provided. The substrate is formed of an insulating film layer where a groove is formed, a barrier metal layer, and a wiring metal layer in order from a bottom in at least a part of a region. The method includes (1) while the wiring metal layer is exposed to a surface of the substrate, a step of removing the surface of the substrate, (2) while the wiring metal layer and the barrier metal layer are exposed to the surface of the substrate, a step of removing the surface of the substrate, and (3) while the wiring metal layer, the barrier metal layer, and the insulating film layer are exposed to the surface of the substrate: a step of bringing the surface of the substrate into contact with a catalyst; a step of supplying a process liquid between the catalyst and the surface of the substrate; and a step of applying a voltage or flowing a current between the catalyst and the surface of the substrate.

DESCRIPTION OF EMBODIMENTS

The following describes a method for processing a substrate and a substrate processing apparatus according to the present invention with the attached drawings. In the attached drawings, identical or similar reference numerals are attached to identical or similar components, and overlapping description regarding the identical or similar components may be omitted in the description of the respective embodiments. Features shown in the respective embodiments are applicable to other embodiments in so far as they are consistent with one another. In the specification, the "substrate" includes not only a semiconductor substrate, a glass substrate, and a printed circuit substrate, but also a magnetic recording medium, a magnetic recording sensor, a mirror, an optical element and a micro mechanical element, or a partially fabricated integrated circuit.

Figure 1:
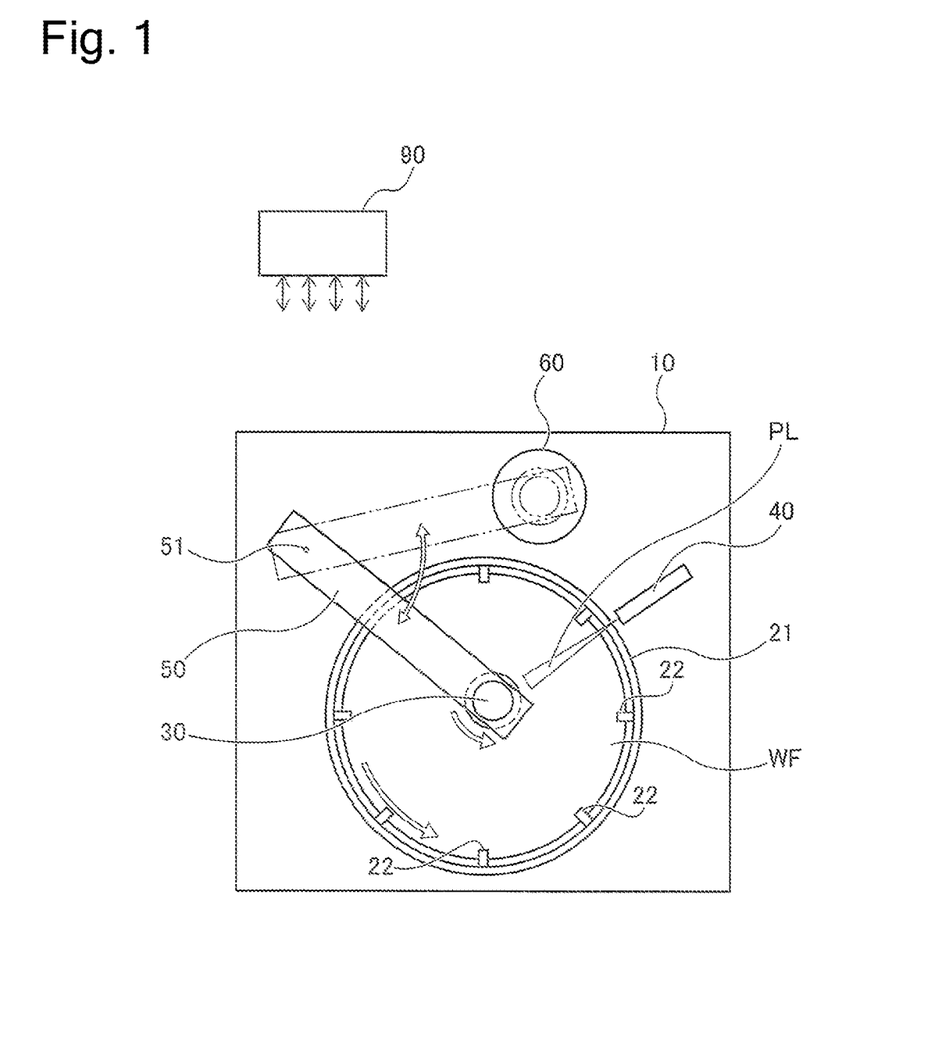
FIG. 1 is a schematic plan view of a substrate processing apparatus according to one embodiment.
Figure 2:
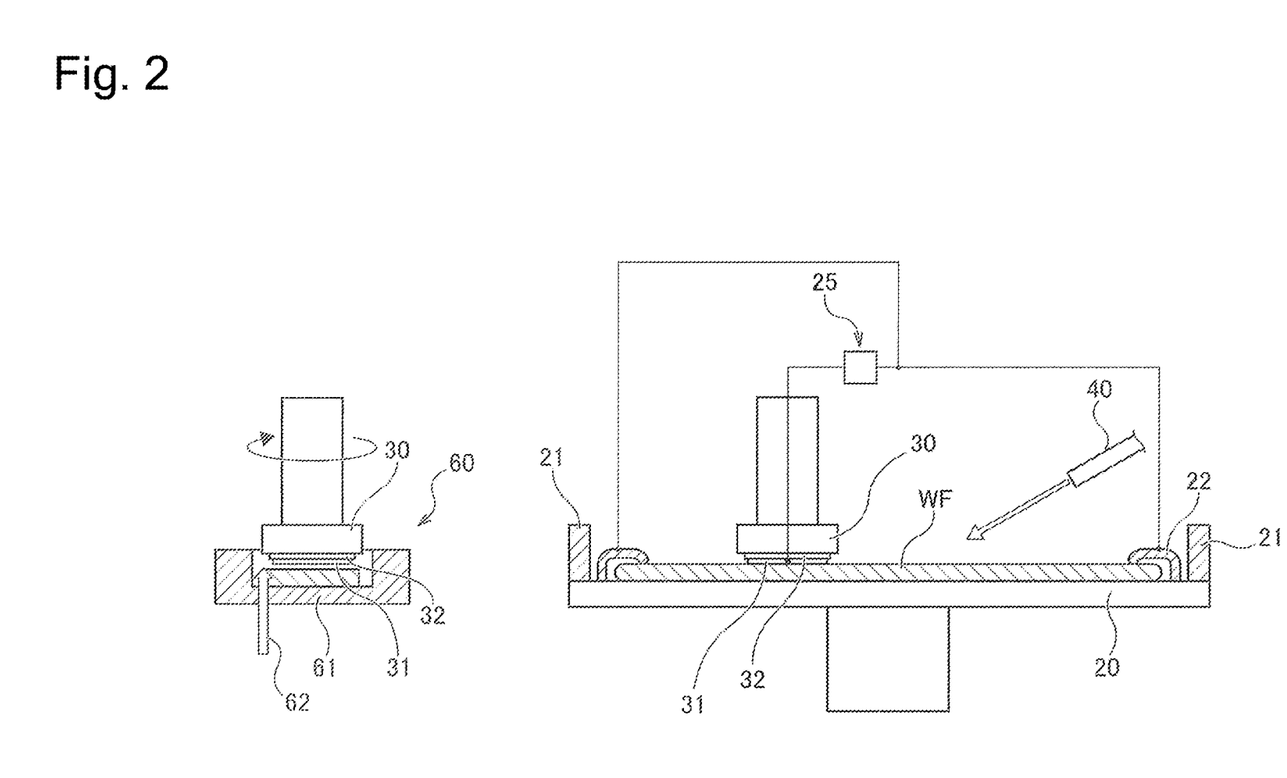
FIG. 2 is a side view of the substrate processing apparatus illustrated in FIG. 1.
Figure 10:
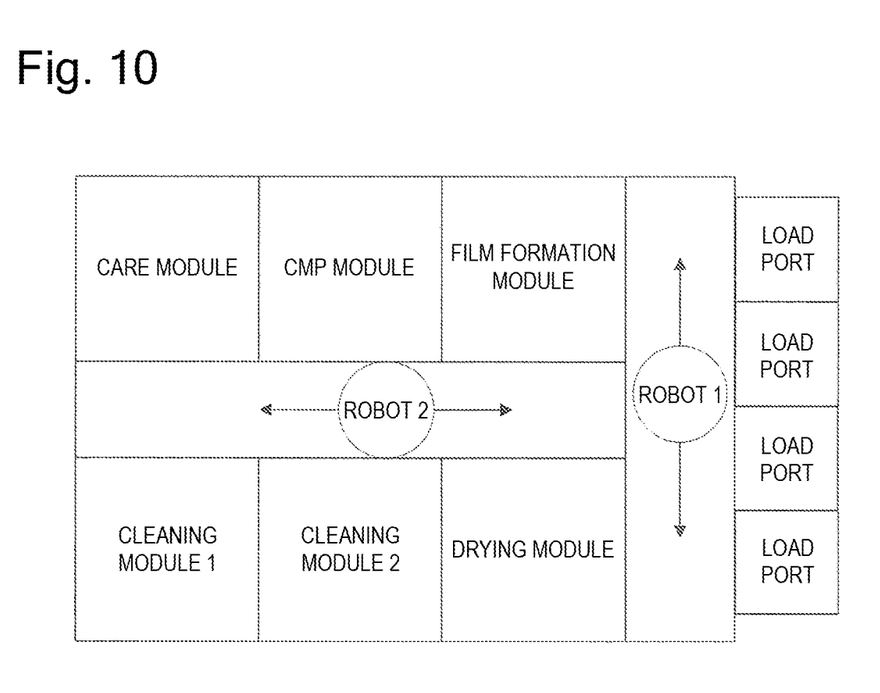
FIG. 10 is a block diagram schematically illustrating a substrate processing system according to one embodiment.

FIG. 1 is a schematic plan view of a substrate processing apparatus 10 according to one embodiment. FIG. 2 is a side view of the substrate processing apparatus 10 illustrated in FIG. 1. The substrate processing apparatus 10 is a device that performs an etching process to a surface of a substrate WF using a CARE method. The substrate processing apparatus 10 can constitute as a part of a substrate processing system. FIG. 10 is a block diagram schematically illustrating the substrate processing system according to one embodiment. The substrate processing system includes load ports, a CMP module, a CARE module, a film formation module, cleaning modules, and a drying module. The substrate processing system also includes robots for conveying a substrate inside the substrate processing system. In the substrate processing system illustrated in FIG. 10, the load ports hold the substrate before the process and hold the substrate after the process. A robot 1 can receive the substrate before the process from the load ports and hand over the substrate to a robot 2. The robot 2 can convey the substrate between the film formation module, the CMP module, the CARE module, cleaning modules 1 and 2, the drying module, and the robot 1. The CARE module of the substrate processing system can have any features of the substrate processing apparatus 10 described below. Additionally, the substrate processing system can have any configuration and any kinds and any number of modules other than the CARE module.

The substrate processing apparatus 10 illustrated in FIG. 1 and FIG. 2 includes a table 20 for holding the substrate WF, a head 30 for holding a catalyst 31, a nozzle 40 for supplying a process liquid PL onto the substrate WF held on the table 20, an arm 50 for swinging the head 30 in a parallel direction to the substrate, a conditioner 60, and a controller 90.

The table 20 is configured to hold the substrate WF. In the embodiment illustrated in the drawing, the table 20 holds the substrate WF such that a surface to be processed of the substrate WF faces upward. Additionally, in the embodiment illustrated in the drawing, the table 20 includes a vacuum suction mechanism as a mechanism for holding the substrate WF. The vacuum suction mechanism has a vacuum suction plate that vacuum-suctions a back surface (surface on the opposite side of the surface to be processed) of the substrate WF. In order to stabilize a suction state, a backing material may be laminated on a surface of the suction plate to cause the substrate WF to be suctioned on the table 20 via this backing material. The mechanism for holding the substrate WF on the table 20 can be any known mechanism. For example, the mechanism may be a clamp mechanism that clamps a front surface and the back surface of the substrate WF in at least one position of a peripheral edge portion of the substrate WF and may be a roller chuck mechanism that holds a side surface of the substrate WF in at least one position of the peripheral edge portion of the substrate WF.

The table 20 is configured to be rotatable by a drive unit motor and an actuator (not illustrated).

Additionally, in this drawing, the table 20 includes a wall 21 that extends upward in the vertical direction over a whole circumferential direction on the outer side with respect to a region for holding the substrate WF. This allows the process liquid PL to be maintained within the surface of the substrate WF, and consequently, an amount of the process liquid PL to be used can be reduced. Note that, while the wall 21 is secured to an outer periphery of the table 20 in this drawing, the wall 21 may be configured as a separate body from the table. In that case, the wall 21 may be configured to be vertically moveable. Since the wall 21 can vertically move, a retention amount of the process liquid PL can be changed, and the process liquid can be efficiently discharged outside the substrate WF by lowering the wall 21 when, for example, the surface of the substrate after the etching process is cleaned with a pure water and a cleaning liquid.

In the embodiment illustrated in FIG. 1 and FIG. 2, the head 30 is configured to hold the catalyst 31 at its lower end. In this embodiment, the catalyst 31 is smaller than the substrate WF. That is, when the catalyst 31 is projected toward the substrate WF, the projected area of the catalyst 31 is smaller than the area of the substrate WF. The head 30 is also configured to be rotatable by the drive unit, namely the actuator (not illustrated). Additionally, a motor and an air cylinder for causing the catalyst 31 of the head 30 to slide in contact with the substrate WF are included in the arm 50 described below (not illustrated).

In one embodiment, the catalyst 31 can contain, for example, ruthenium (Ru), rhodium (Rh), palladium (Pd), argentum (Ag), iridium (Ir), platinum (Pt), and gold (Au). In one embodiment, the catalyst 31 can be a single element metal among these. In one embodiment, the catalyst 31 can be an alloy mainly composed of any one of these metals.

In one embodiment, the catalyst 31 is secured to a surface of a base member 32 having a reference surface. In one embodiment, the catalyst 31 is formed on a surface of the base member 32 by any one of the methods including a sputter deposition method, a chemical vapor deposition method (CVD), a vapor deposition method, and a plating method. When the catalyst 31 is formed on the surface of the base member 32 using the sputter deposition method, a plurality of metallic materials to become the catalyst may be simultaneously sputtered, other metallic materials may be arranged on one metallic material to be sputtered, and an alloyed material may be sputtered. Additionally, alloy layers may be formed by performing heat treatment on different metallic element layers after their lamination. When the catalyst 31 is formed on the base member 32 having the reference surface, the base member 32 may be formed of an elastic material, such as a rubber and a sponge, which has elasticity. Using the elastic member for the base member 32 relatively increases a contact pressure at a projecting portion of the surface of the substrate WF as a process target and causes the projecting portion to be selectively removed. Additionally, the surface of the base member 32 where the catalyst 31 is held is preferably provided with a groove with any given pattern. Providing the groove allows the supplied process liquid to pass inside the groove and allows the process liquid to be efficiently supplied between the surface of the catalyst 31 and the surface of the substrate WF as the process target. In one embodiment, a foil of the catalyst 31 may be secured to the base member 32 formed of an elastic material with an adhesive agent, and the like. In this case, while a reference surface follows a surface shape of the substrate WF as the process target, delamination of the catalyst 31 caused by expansion and contraction of an elastic body can be reduced. Note that, while FIG. 2 illustrates one head 30, the process may be performed using a plurality of heads 30. In this case, each of the heads 30 may have the same catalyst 31 and may have a different catalyst depending on an exposed material of the substrate WF as the process target. When each of the heads 30 has the same catalyst 31, the area of the substrate WF that is covered by the catalysts 31 increases, and thus, a speed of the process increases. When each of the heads 30 has a different catalyst 31, an etching rate of each material can be adjusted by action of each catalyst 31 even with a plurality of etched targets exposed.

Next, the nozzle 40 is configured to supply the process liquid PL to the surface of the substrate WF. Here, while the embodiment illustrated in FIG. 1 and FIG. 2 has one nozzle 40, a plurality of nozzles 40 may be arranged. In that case, a different process liquid may be supplied from each of the nozzles 40 corresponding to a processing step. Additionally, by supplying a different process liquid from each of the nozzles and changing a supply flow rate of the process liquid from each of the nozzles 40 corresponding to a processing step, a composition ratio of the mixed process liquids may be changed. When the process liquids are supplied from the plurality of nozzles 40, the composition of the process liquids may be changed by selecting the process liquid to be supplied from each of the nozzles corresponding to the processing step. Additionally, when the surface of the substrate WF is cleaned in the substrate processing apparatus 10 after the etching process, the nozzles 40 may supply cleaning chemicals and a water. In one embodiment, the process liquid can be a liquid in which a liquid containing a compound having oxidizing property and an electrolyte are mixed. As one example, the liquid containing the compound having the oxidizing property can contain at least one of a hydrogen peroxide and an ozone water. The electrolyte to be mixed can contain at least one of an acid electrolyte, a neutral electrolyte, and a basic electrolyte. The acid electrolyte can contain, for example, at least one of an inorganic acid and a water-soluble organic acid. The inorganic acid includes hydrochloric acid, nitric acid, sulfuric acid, and phosphoric acid. The water-soluble organic acid contains a fatty acid, such as citric acid, oxalic acid, formic acid, and acetic acid. The neutral electrolyte can contain, for example, at least one of potassium chloride, sodium chloride, and sodium sulfate. The basic electrolyte can contain, for example, at least one of the inorganic acid, such as potassium hydroxide, sodium hydroxide, and calcium hydroxide, and any organic matter, such as ammonia. A pH of the process liquid is preferably adjusted within a range between 1 or more and 14 or less. Note that, when the process liquids with a plurality of compositions or with different composition ratios are used corresponding to the processing steps, a step of cleaning the surface of the substrate WF may be inserted between the respective processing steps. Providing the cleaning step can avoid mixing a process liquid used in a former step with a process liquid to be used in a next step. Additionally, for each of the process liquids, a temperature of each of the process liquids may be adjusted with a temperature control mechanism (not illustrated).

Next, the arm 50 is configured to be swingable around a rotational center 51 and is configured to be vertically movable by the drive unit, namely the actuator (not illustrated). Here, in this embodiment, the catalyst 31 is smaller than the substrate WF. Accordingly, when the etching process is performed on the whole surface of the substrate WF, the head 30 swings on the whole surface of the substrate WF. Here, since this CARE method causes etching only on a contact portion where the catalyst is in contact with the substrate WF, a distribution of contact period of the substrate WF and the catalyst 31, in respective regions of the substrate WF within the surface of the substrate WF, significantly influences a distribution of etching amount in the respective regions of the substrate WF within a surface of a wafer. Regarding this, the distribution of the contact period can be equalized by making a swing speed of the arm 50 within the surface of the wafer variable. Specifically, a swing range of the arm 50 within the surface of the substrate WF is divided into a plurality of sections, and the swing speed is controlled in each of the sections. Note that the head 30 is rotatably attached to a distal end of the arm 50 (end portion on the opposite side of the rotational center 51).

In the embodiment illustrated in FIG. 2, the substrate processing apparatus 10 includes a plurality of electrodes 22 configured to be in contact with a conductive layer on the surface of the substrate WF arranged on the table 20. The plurality of electrodes 22 are arranged in a circumferential direction of the substrate WF, for example at equal intervals. The electrodes 22 are configured to rotate together with the table 20. Accordingly, since the electrodes 22 and the substrate WF do not relatively move, a risk of damage on the surface of the substrate WF caused by the electrodes 22 can be reduced. In one embodiment, the electrodes 22 may be secured to the table 20. As illustrated in the drawing, the electrodes 22 are configured to be electrically connected to a power source 25. For polarity, in one embodiment, the electrodes 22 are connected to the positive side of the power source 25, and the catalyst 31 held on the head 30 is electrically connected to the negative side of the power source 25. However, the polarity may be changed according to exposure conditions of etching target materials to the substrate WF. With this configuration, the substrate processing apparatus 10 can flow a current from the electrodes 22 through the conductive layer of the substrate WF to the catalyst 31. By flowing the current to the substrate WF and the catalyst, an etching by an electrolytic reaction is added to the etching by the CARE to allow for performing a more highly efficient process. While, generally in an electrolytic etching, a conductive layer of a substrate as a process target and a counter electrode are usually separated to avoid an electrical short, the inventors of this application have confirmed through an experiment that the etching rate changes by applying a voltage to a substrate and a catalyst even in a state of an electrical short in the CARE according to this disclosure. Note that in this power feeding method, in order to avoid a contact with a process liquid except for contact portions with the conductive layer on the surface of the substrate WF, the electrodes 22 may be provided with a coating material (not illustrated), such as a resin material. Additionally, the electrodes 22 may be provided with a sealing material circumferentially on the center side of the substrate WF to avoid the contact with the process liquid. When the electrodes 22 are in contact with the process liquid on portions other than the contact portions with the conductive layer on the surface of the substrate WF, the electrodes 22 have a possibility of generating an irregular electrolytic etching near the contact portions with the conductive layer on the surface of the substrate WF by forming an electric circuit through ions in the process liquid and a possibility of generating poor power feeding by having the electrodes 22 themselves being etched. Arranging this coating material or the sealing material allows for suppressing the irregular electrolytic etching. Note that a material of the electrodes 22 preferably has a conductive property as well as an etching resistance to the process liquid.

Figure 3:
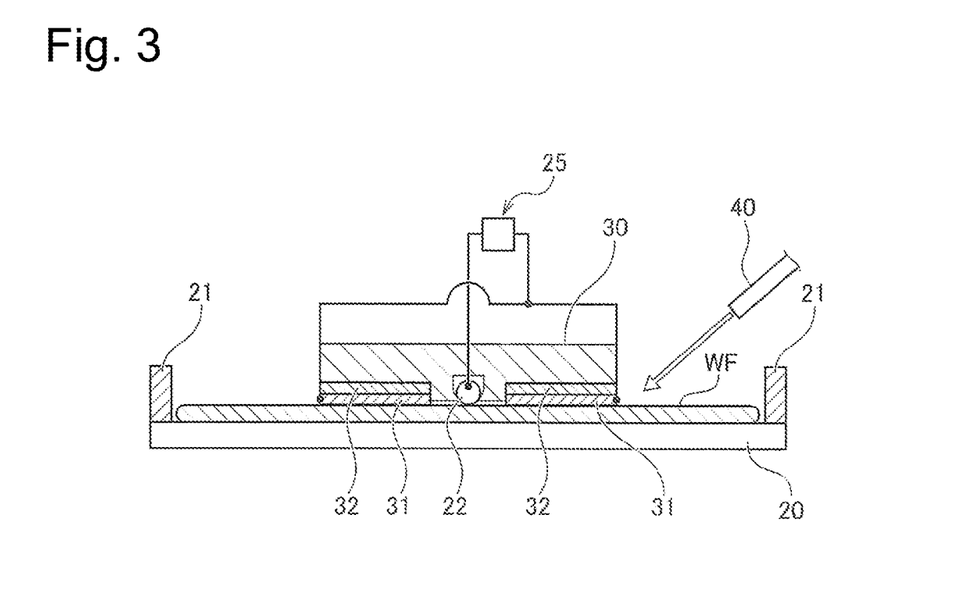
FIG. 3 is a side view schematically illustrating an electrical configuration of the substrate processing apparatus according to one embodiment.

FIG. 3 is a side view schematically illustrating an electrical configuration of the substrate processing apparatus 10 according to one embodiment. In the embodiment illustrated in FIG. 3, an electrode 22 is disposed inside the head 30 and arranged so as to be in contact with and feed power to the conductive layer on the surface of the substrate WF arranged on the table 20. In the embodiment illustrated in FIG. 3, the electrode 22 is arranged at the center of the lower end of the head 30. In the embodiment illustrated in FIG. 3, the electrode 22 is configured to be rotatable and is configured to rotate following relative movement between the table 20 and the head 30. Accordingly, since the electrode 22 and the substrate WF do not relatively move, a risk of damage on the surface of the substrate WF caused by the electrode 22 can be reduced. As illustrated in the drawing, the electrode 22 inside the head 30 is configured to be electrically connected to the power source 25, and the electrode 22 is connected to the positive side of the power source 25. On the other hand, the catalyst 31 held on the head 30 is electrically connected to the negative side of the power source 25. Accordingly, the substrate processing apparatus 10 can flow a current from the electrode 22 through the conductive layer of the substrate WF to the catalyst 31. By flowing the current to the substrate WF and the catalyst, an etching by an electrolytic reaction is added to the etching by the CARE to allow for performing a more highly efficient process. Note that in this power feeding method, in order to avoid a contact with a process liquid except for contact portions with the conductive layer on the surface of the substrate WF, the electrode 22 may be provided with a sealing material (not illustrated) for avoiding an invasion of a process liquid. When the electrode 22 is in contact with the process liquid on portions other than the contact portions with the conductive layer on the surface of the substrate WF, the electrode 22 has a possibility of generating an irregular electrolytic etching near the contact portions with the conductive layer on the surface of the substrate WF by forming an electric circuit through ions in the process liquid and a possibility of generating poor power feeding by having the electrode 22 itself being etched. Arranging this sealing material allows for suppressing the irregular electrolytic etching. Note that a material of the electrode 22 preferably has a conductive property as well as an etching resistance to the process liquid. Additionally, while one electrode 22 is provided in the embodiment illustrated in FIG. 3, a plurality of electrodes 22 may be provided as another embodiment. This is because the one electrode 22 has sometimes difficulty in ensuring the contact with the conductive layer on the surface of the substrate WF depending on a moving position when the head 30 moves within the surface of the substrate WF to perform the process on the whole surface of the substrate WF. Having a plurality of electrodes 22 facilitates ensuring the contact of the electrodes 22 with the conductive layer. Additionally, while the embodiment illustrated in FIG. 3 has a structure in which the electrode 22 is secured inside the head 30, the electrode 22 may be arranged at an outer peripheral portion of the head 30 as another embodiment. Furthermore, one embodiment may have a structure in which the electrode 22 is in contact with the conductive layer of the substrate WF at a position independent from the head 30 and follows the relative movement with the substrate WF.

Figure 4:
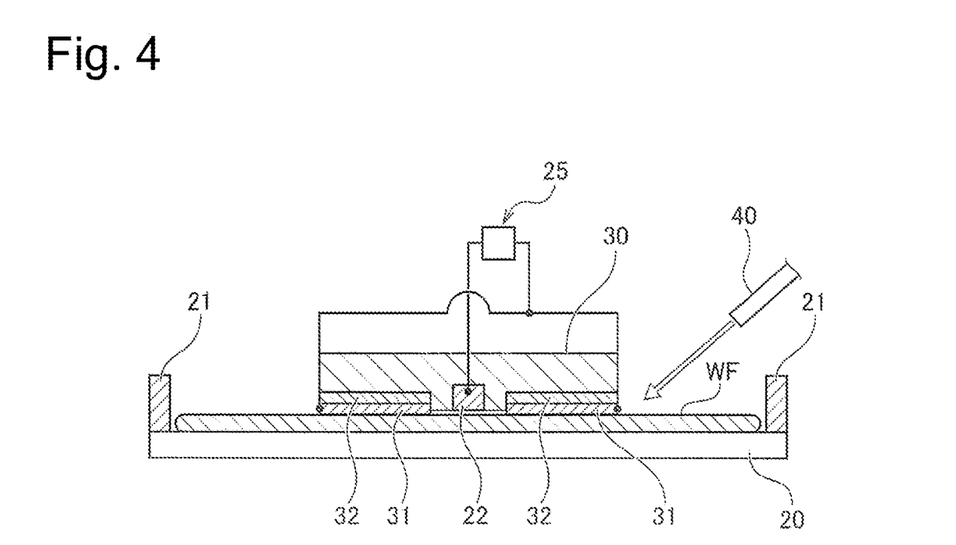
FIG. 4 is a side view schematically illustrating an electrical configuration of the substrate processing apparatus according to one embodiment.

FIG. 4 is a side view schematically illustrating an electrical configuration of the substrate processing apparatus 10 according to one embodiment. In the embodiment illustrated in FIG. 4, the electrode 22 is disposed inside the head 30. In the embodiment illustrated in FIG. 4, the electrode 22 is arranged so as to be close to the surface of the substrate WF arranged on the table 20 but not to be in contact with the substrate WF. In the embodiment illustrated in FIG. 4, the electrode 22 is arranged at the center of the lower end of the head 30. In the embodiment illustrated in FIG. 4, since the electrode 22 does not come in contact with the substrate WF, a risk of damage on the surface of the substrate WF caused by the electrode 22 can be reduced. As illustrated in the drawing, the electrode 22 inside the head 30 is configured to be electrically connected to the power source 25, and the electrode 22 is connected to the positive side of the power source 25. On the other hand, the catalyst 31 held on the head 30 is electrically connected to the negative side of the power source 25. In the embodiment illustrated in FIG. 4, a process liquid contains an electrolyte. Accordingly, the substrate processing apparatus 10 can flow a current from the electrode 22 via ions in the process liquid indirectly through the conductive layer of the substrate WF to the catalyst 31. By flowing the current to the substrate WF and the catalyst, an etching by an electrolytic reaction is added to the etching by the CARE to allow for performing a more highly efficient process. Note that while one electrode 22 is provided in FIG. 4, a plurality of electrodes 22 may be provided. This is because the one electrode 22 has sometimes difficulty in being opposed to the conductive layer on the surface of the substrate WF via the process liquid depending on a moving position when the head 30 moves within the surface of the substrate WF to perform the process on the whole surface of the substrate WF. Having a plurality of electrodes 22 facilitates being opposed to the conductive layer via the process liquid. Additionally, while in the structure in FIG. 4, the electrode 22 is secured inside the head 30, the electrode 22 may be arranged at an outer peripheral portion of the head 30. Furthermore, the electrode 22 may be opposed to the conductive layer of the substrate WF at a position independent from the head 30 via the process liquid.

Here, a voltage to be applied between the catalyst 31 and the substrate WF differs depending on the power feeding method. For example, the cases of the embodiments illustrated in FIG. 2 and FIG. 3 are different from the case of the embodiment illustrated in FIG. 4. This is because, in the case of the embodiment illustrated in FIG. 4, the current via the ions in the process liquid flows at two portions which are the contact portion between the catalyst 31 and the conductive layer of the substrate WF and the opposed portion between the conductive layer of the substrate WF and the electrode 22, and the electric circuit is different from that in the method in which the conductive layer of the substrate WF and the electrode 22 are in contact as the embodiments illustrated in FIG. 2 and FIG. 3. Note that the applied voltage differs depending on the electrolytic reaction caused between the conductive layer of the substrate WF and the electrode 22. For example, when an electrolysis reaction of water is used, a power supply voltage is adjusted such that the voltage of 1.23 V or more as a theoretical electrolysis voltage is applied between the conductive layer of the substrate WF and the electrode 22. However, when the applied voltage is too large, a side reaction, such as a gas generation, other than an etching reaction as a main reaction occurs near the surface of the conductive layer of the substrate WF, and thus, the supply of the process liquid to the surface of the conductive layer is sometimes inhibited due to reduction in current efficiency and the generated gas. Therefore, the voltage to be applied between the catalyst 31 and the substrate WF is preferably 10 V or less, more preferably 5 V or less. Additionally, it is known that the etching rate in the electrolytic etching is usually proportionate to a current density. Thus, when a single etching target material is exposed, or when a plurality of etching target materials are exposed but an area ratio is constant, the power source 25 may be controlled such that the current value becomes constant. On the other hand, when a plurality of etching target materials are exposed while the area ratio changes at a time of the process, the current densities of the respective materials change according to the change in the area ratio, which causes the current density to change and eventually causes difficulty in controlling the etching rate. In this case, the power source 25 is preferably controlled such that the voltage value becomes constant.

The conditioner 60 is configured to condition the surface of the catalyst 31 at a predetermined timing. This conditioner 60 is arranged outside the substrate WF held on the table 20. The catalyst 31 held on the head 30 can be arranged on the conditioner 60 with the arm 50.

In the embodiment illustrated in FIG. 2, the conditioner 60 includes a scrub cleaning unit 61. The scrub cleaning unit 61 has scrub members, such as a sponge and a brush, and performs scrub cleaning on the catalyst 31 under the presence of a conditioning liquid supplied from a cleaning liquid supply unit 62. A contact of the head 30 and the scrub members of the scrub cleaning unit 61 at this time is achieved by a vertical movement of the head 30 side or the scrub members. Additionally, at the time of the conditioning, at least one of the head 30 or the scrub members of the scrub cleaning unit 61 is allowed to make relative movement, such as rotation. This can recover the surface of the catalyst 31 where etching products are attached to an active state, and besides, inhibit the region of the substrate WF to be processed from receiving damage caused by the etching products.

The conditioner 60 is not limited to the above-described configuration, and various kinds of configurations is employable. For example, water is basically applicable for the conditioning liquid at this scrub cleaning unit 61 but has sometimes difficulty in removal only by the scrub cleaning depending on the etching products. In that case, a chemical solution that can remove the etching products may be supplied as the cleaning liquid. For example, when the etching product is silicate ($SiO_2$), hydrofluoric acid may be used as the chemical solution. Alternatively, the conditioner 60 may include an electrolytic regeneration unit configured to remove the etching products on the surface of the catalyst 31 using an electrolytic action. Specifically, the electrolytic regeneration unit has an electrode configured to be electrically connectable to the catalyst 31 and may be configured to remove the etching products attached on the surface of the catalyst 31 by applying a voltage between the catalyst and the electrode. When the electrolytic reaction is identical to a removal reaction of the etching products by the conditioning liquid, a conditioning speed can be accelerated by an electric energy. When the electrolytic reaction is a different reaction from the removal reaction of the etching products by the conditioning liquid, the conditioning speed increases by adding the electrolytic reaction to the etching reaction by the conditioning liquid to allow for conditioning the catalyst 31 in a short time.

Alternatively, the conditioner 60 may include a plating regeneration unit that is configured to regenerate the catalyst 31 by newly plating the catalyst 31. This plating regeneration unit has an electrode configured to be electrically connectable to the catalyst 31 and is configured to perform the plating regeneration on the surface of the catalyst 31 by applying a voltage between the catalyst 31 and the electrode while the catalyst 31 is immersed in a liquid including a catalyst for regeneration.

The controller 90 controls general operation of the substrate processing apparatus 10. The controller 90 can be constituted by a common general-purpose computer, a dedicated computer, and the like. The controller 90 also controls parameters related to conditions of the etching process of the substrate WF. These parameters include, for example, a movement condition, such as a rotation and an angle rotation of the head 30, a contact pressure of the catalyst 31 and the substrate WF, a swing condition of the arm 50, a supply condition, such as a flow rate of the process liquid from the nozzle 40 and a temperature of the process liquid, an electric potential condition provided between the substrate WF and the catalyst 31, and a conditioning condition of the surface of the catalyst on the conditioner 60.

Figure 5:
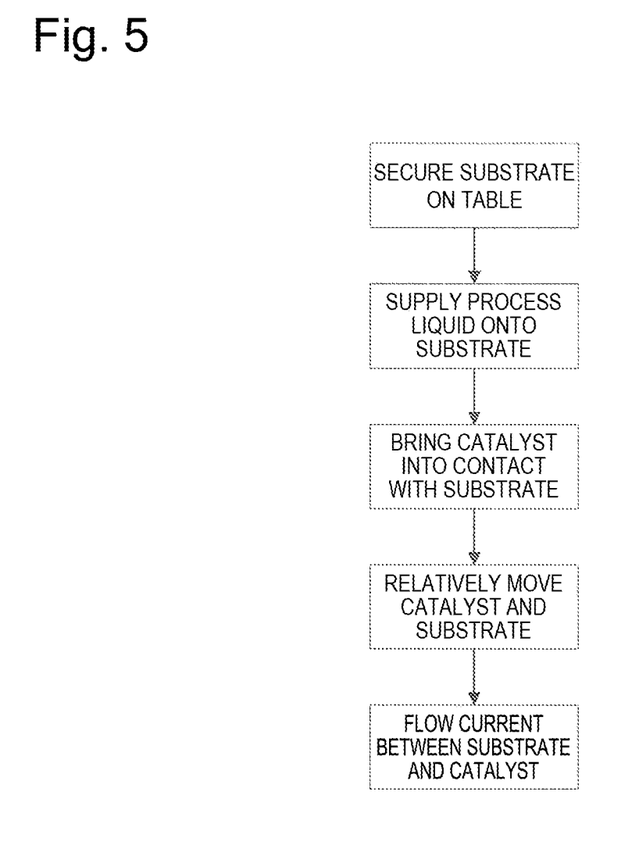
FIG. 5 is a flowchart illustrating a method for processing a substrate according to one embodiment.
Figure 6:
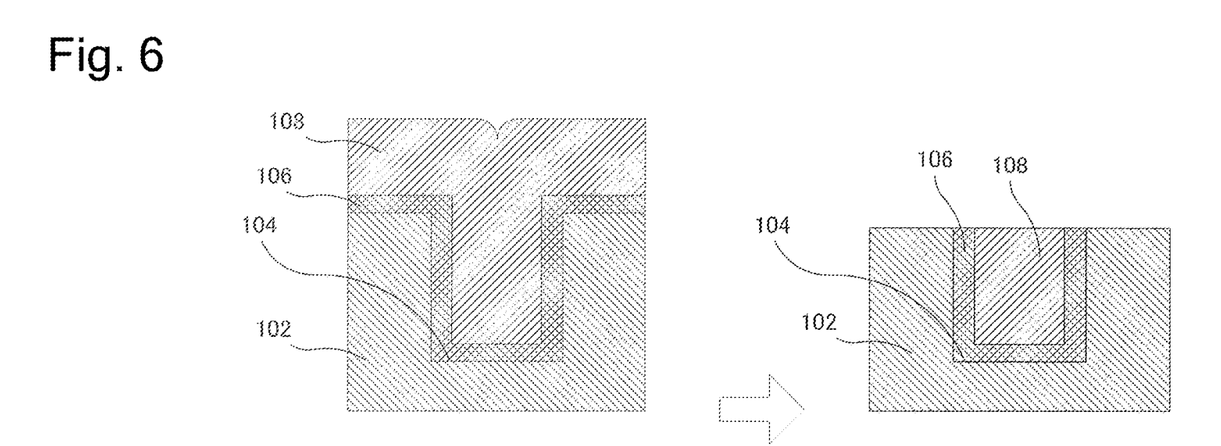
FIG. 6 is a cross-sectional view schematically illustrating a process stage of a substrate by a method for processing the substrate according to one embodiment.

FIG. 5 is a flowchart illustrating a method for processing a substrate according to one embodiment. FIG. 6 is a cross-sectional view schematically illustrating a process stage of a substrate by a method for processing the substrate according to one embodiment. As illustrated in FIG. 6, the substrate WF includes an insulating film layer 102. As illustrated in the drawing, the substrate WF has a structure in which a wiring metal layer 108 is embedded in a groove formed on the insulating film layer 102 via a barrier metal layer 106. The insulating film layer 102 is made of, for example, silicon oxide or a Low-k material. On the insulating film layer 102, a groove 104 is formed. The barrier metal layer 106 is formed on a surface of the insulating film layer 102. The barrier metal layer 106 is made of, for example, Ta, Ti, TaN, TiN, Co, or the like. The wiring metal layer 108 is formed on top of the barrier metal layer 106. The wiring metal layer 108 is made of, for example, Ru, Co, Cu, W or the like.

As illustrated in FIG. 6, when the substrate where the wiring metal layer 108 is embedded in the insulating film layer 102 is planarized, the wiring metal layer 108, the barrier metal layer 106, and the insulating film layer 102 should be simultaneously planarized. According to the process illustrated in FIG. 5, the substrate illustrated in FIG. 6 is planarized by the CARE method. In the planarization of the substrate, the substrate processing apparatus 10 having any configuration described above may be used. The operation of the substrate processing apparatus 10 is controlled by the controller 90.

First, the substrate WF is held on the table 20. Next, the nozzle 40 supplies the process liquid onto the substrate WF. Next, the arm 50 moves the catalyst 31 held on the head 30 so as to be arranged on a predetermined position on the substrate WF. Then, the vertical movement of the head 30 brings the surface of the substrate WF and the catalyst into contact and adjusts to bring a predetermined contact pressure. Additionally, immediately before the substrate WF and the catalyst 31 are brought into contact, at the same time of the contact, or after the contact, the substrate WF and the catalyst 31 are relatively moved. For example, the table 20 and the head 30 are rotated, and the arm 50 is swung. Additionally, immediately before the substrate WF and the catalyst 31 are brought into contact, at the same time of the contact, or after the contact, a voltage is applied between the electrode 22 and the catalyst 31.

By bringing the catalyst 31 into contact with the substrate WF under the presence of the process liquid, a catalytic action produces an etchant. By an action of the produced etchant on the surface of the substrate WF, an etching removal is performed on the surface of the substrate WF. When the substrate WF illustrated in FIG. 6 is planarized, the wiring metal layer 108 first comes in contact with the catalyst 31 to perform the etching removal on the wiring metal layer 108. Additionally, according to this embodiment, a voltage is applied between the catalyst 31 and the electrode 22 in contact with the surface of the substrate WF, and the wiring metal layer 108 on the surface of the substrate WF is conductive. Thus, a current flows from the surface of the substrate WF to the catalyst 31. Therefore, an action of the electrolytic etching is further added to the etching by the ordinary CARE, and the surface of the substrate WF can be removed more highly efficiently. Additionally, by controlling the magnitude of the voltage to be applied, the etching rate can be also controlled. Additionally, removing, for example, the wiring metal layer 108 and the barrier metal layer 106 causes the most part of the substrate WF to be the insulating film layer 102. Even when the current does not flow between the catalyst 31 and the substrate WF, providing an electric potential between the catalyst 31 and the substrate WF brings effect to modify a surface condition of the catalyst 31 and to suppress adsorption of ions in the process liquid and transformation of the catalyst 31. Accordingly, it is effective to provide the electric potential between the catalyst 31 and the substrate WF.

According to the embodiment illustrated in FIG. 6, by the CARE in a state of flowing the current from the substrate to the catalyst, the wiring metal layer 108 is first removed. Next, the wiring metal layer 108 and the barrier metal layer 106 are simultaneously removed. Finally, the wiring metal layer 108, the barrier metal layer 106, and the insulating film layer 102 are simultaneously removed. The kind of the catalyst 31, the kind and the concentration of the process liquid, the voltage to be applied, processing time, and the like are appropriately selected corresponding to the substrate as a process target.

Figure 7:
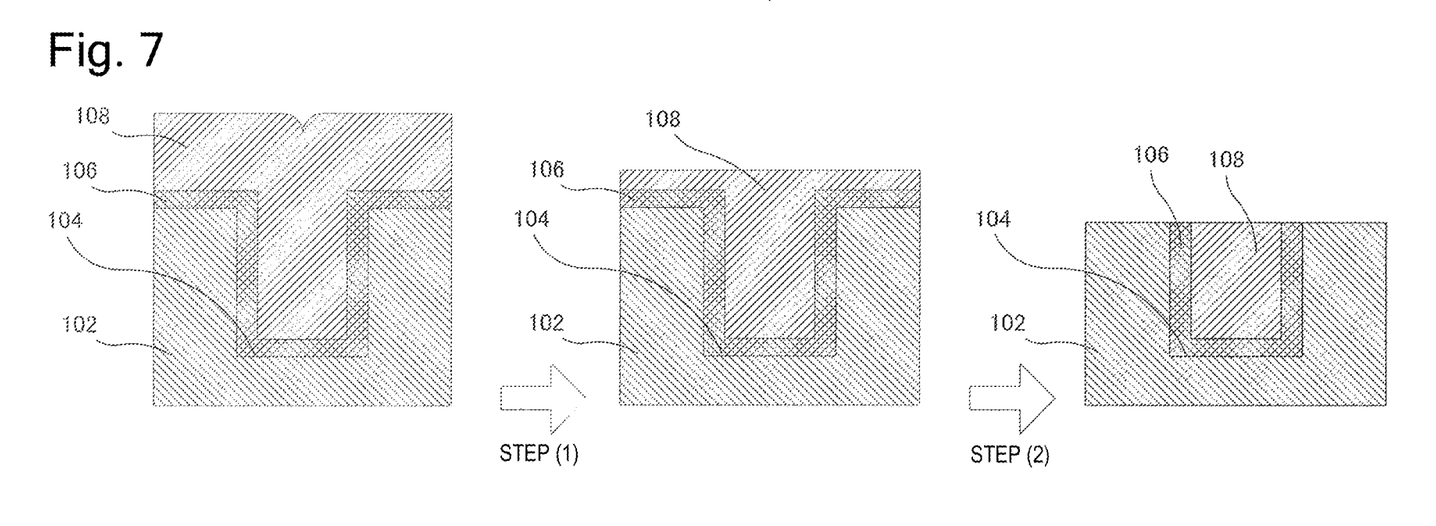
FIG. 7 is a cross-sectional view schematically illustrating a process stage of a substrate by a method for processing the substrate according to one embodiment.

FIG. 7 is a cross-sectional view schematically illustrating a process stage of a substrate by a method for processing the substrate according to one embodiment. As illustrated in FIG. 7, the substrate WF as the process target is identical to the substrate WF illustrated in FIG. 6.

The process of the substrate according to this embodiment is conceptually divided into two steps. First, in step (1), a part of the wiring metal layer 108 on the surface of the substrate WF is removed. In the step (1), the wiring metal layer 108 is removed until immediately before the barrier metal layer 106 is exposed. For example, in the step (1), the wiring metal layer 108 is removed until the thickness of the wiring metal layer 108 becomes around 10 mm. In the step (1), the wiring metal layer 108 may be removed by a CMP. Alternatively, in the step (1), the wiring metal layer 108 may be removed by the CARE as described above in which the current is applied. Next, in step (2), the remaining of the wiring metal layer 108 is removed by the CARE as described above in which the current is applied. Next, the wiring metal layer 108 and the barrier metal layer 106 are simultaneously removed. Finally, the wiring metal layer 108, the barrier metal layer 106, and a part of the insulating film layer 102 are simultaneously removed. In this embodiment, the process of the substrate is performed in the step (1) on conditions in which a removal rate becomes larger than that of the step (2). When the step (1) and the step (2) are performed by the CARE, at least one of the process conditions is set to be a different condition. The process conditions include, for example, the kind of the catalyst, the kind and the concentration of the process liquid, and the magnitude of the voltage. In the step (1), since only the wiring metal layer 108 is removed, it is only necessary for the process conditions to allow for removing the wiring metal layer 108. In the step (2), since the wiring metal layer 108, the barrier metal layer 106, and the insulating film layer 102 are removed, it is necessary for the process conditions to allow for removing these. Additionally, when both the step (1) and the step (2) are performed by the CARE, different substrate processing apparatus 10 may be used, or the same substrate processing apparatus 10 may be used. For example, by configuring the substrate processing apparatus 10 to include two heads 30 holding different catalysts 31, the CARE can be performed with the same substrate processing apparatus 10 using the different catalysts 31.

Figure 8:
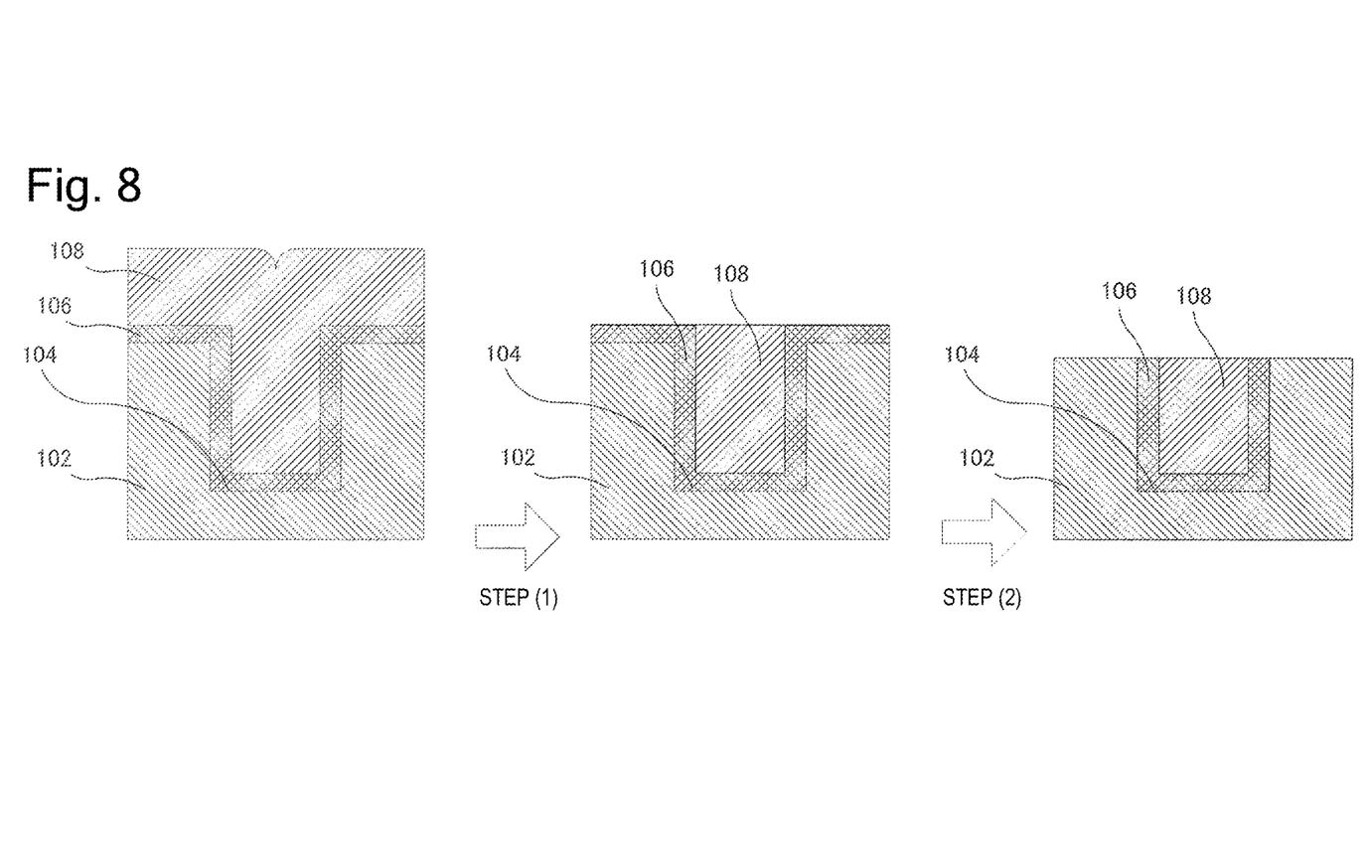
FIG. 8 is a cross-sectional view schematically illustrating a process stage of a substrate by a method for processing the substrate according to one embodiment.

FIG. 8 is a cross-sectional view schematically illustrating a process stage of a substrate by a method for processing the substrate according to one embodiment. As illustrated in FIG. 8, the substrate WF as the process target is identical to the substrate WF illustrated in FIG. 6.

The process of the substrate according to this embodiment is conceptually divided into two steps. First, in step (1), the wiring metal layer 108 on the surface of the substrate WF is removed until the barrier metal layer 106 is exposed. In the step (1), the wiring metal layer 108 may be removed by the CMP. Alternatively, in the step (1), the wiring metal layer 108 may be removed by the CARE as described above in which the current is applied. It is only necessary for the process conditions of the step (1) to be the conditions that allow for removing the wiring metal layer 108. The process conditions of the step (1) need not be the conditions that allow for removing the barrier metal layer 106 or may be the conditions that allow for removing the barrier metal layer 106. Next, in step (2), by the CARE as described above in which the current is applied, the barrier metal layer 106 exposed to the surface is removed, and next, the wiring metal layer 108, the barrier metal layer 106, and the insulating film layer 102 are simultaneously removed. In this embodiment, the process of the substrate is performed in the step (1) on conditions in which a removal rate becomes larger than that of the step (2). When the step (1) and the step (2) are performed by the CARE, at least one of the process conditions is set to be a different condition. The process conditions include, for example, the kind of the catalyst, the kind and the concentration of the process liquid, and the magnitude of the voltage. In the step (1), since only the wiring metal layer 108 is mainly removed, it is only necessary for the process conditions to allow for removing the wiring metal layer 108. In the step (2), since the wiring metal layer 108, the barrier metal layer 106, and the insulating film layer 102 are removed, it is necessary for the process conditions to allow for removing these. Additionally, when the step (1) and the step (2) are performed, different substrate processing apparatus 10 may be used, or the same substrate processing apparatus 10 may be used. For example, by configuring the substrate processing apparatus 10 to include two heads 30 holding different catalysts 31, the CARE can be performed with the same substrate processing apparatus 10 using the different catalysts 31.

Figure 9:
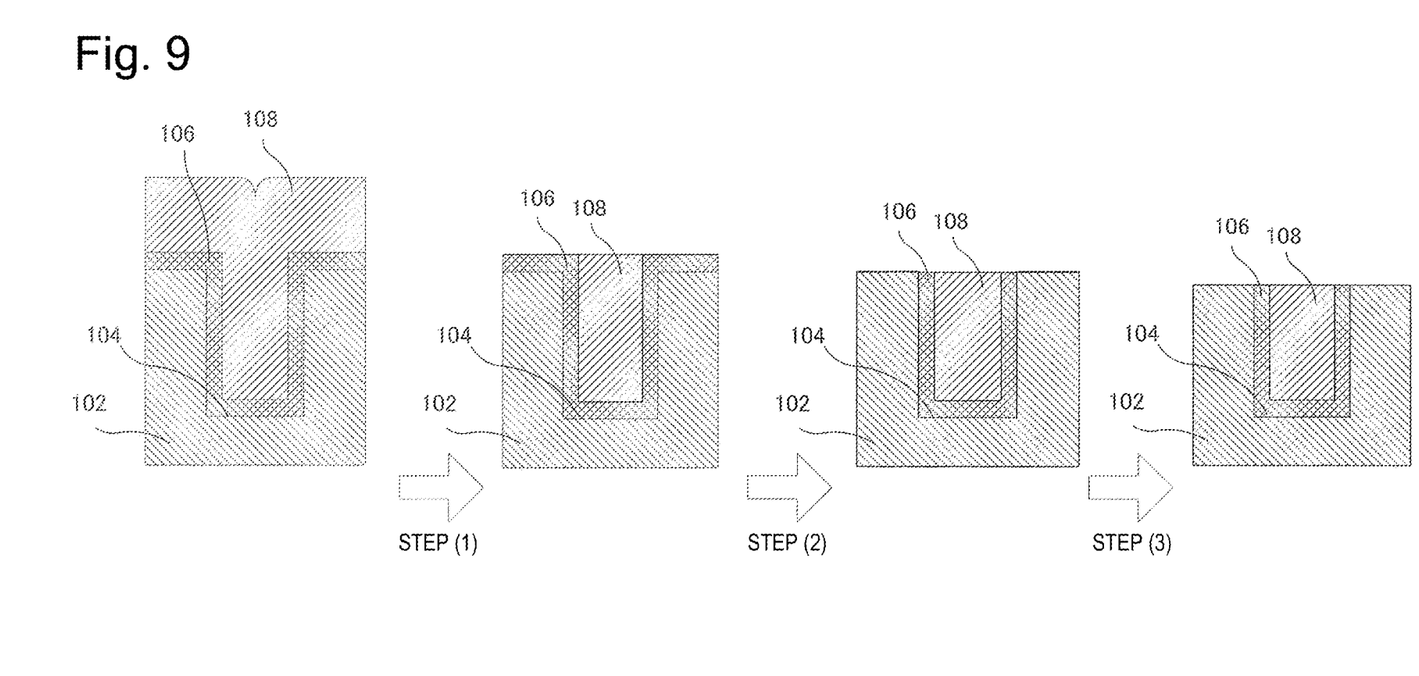
FIG. 9 is a cross-sectional view schematically illustrating a process stage of a substrate by a method for processing the substrate according to one embodiment.

FIG. 9 is a cross-sectional view schematically illustrating a process stage of a substrate by a method for processing the substrate according to one embodiment. As illustrated in FIG. 9, the substrate WF as the process target is identical to the substrate WF illustrated in FIG. 6.

The process of the substrate according to this embodiment is conceptually divided into three steps. First, in step (1), the wiring metal layer 108 on the surface of the substrate WF is removed until the barrier metal layer 106 is exposed. In the step (1), the wiring metal layer 108 may be removed by the CMP. Alternatively, in the step (1), the wiring metal layer 108 may be removed by the CARE as described above in which the current is applied. It is only necessary for the process conditions of the step (1) to be the conditions that allow for removing the wiring metal layer 108. Next, in step (2), by the CARE as described above in which the current is applied, the barrier metal layer 106 and the wiring metal layer 108 are removed until the insulating film layer 102 is exposed to the surface. It is only necessary for the process conditions of the step (2) to be the conditions that allow for removing the barrier metal layer 106 and the wiring metal layer 108, and the process conditions of the step (2) need not be the conditions that allow for removing the insulating film layer 102. Next, in step (3), by the CARE as described above in which the current is applied, the wiring metal layer 108, the barrier metal layer 106, and the insulating film layer 102 are simultaneously removed. In this embodiment, the process of the substrate is performed in the step (1) on conditions in which a removal rate becomes larger than those of the step (2) and the step (3). In the steps (1) to (3), at least one of the process conditions is set to be a different condition. The process conditions include, for example, the kind of the catalyst, the kind and the concentration of the process liquid, and the magnitude of the voltage. In the step (1), since only the wiring metal layer 108 is mainly removed, it is only necessary for the process conditions to allow for removing the wiring metal layer 108. In the step (2), since the wiring metal layer 108 and the barrier metal layer 106 are removed, it is necessary for the process conditions to allow for removing these. In the step (3), since the wiring metal layer 108, the barrier metal layer 106, and the insulating film layer 102 are removed, it is necessary for the process conditions to allow for removing these. Additionally, when the steps (1) to (3) are performed, different substrate processing apparatus 10 may be used, or the same substrate processing apparatus 10 may be used. For example, by configuring the substrate processing apparatus 10 to include two or three heads 30 holding different catalysts 31, the CARE can be performed with the same substrate processing apparatus 10 using the different catalysts 31.

As the substrate continues to be processed by the CARE, the etching products are attached on the surface of the catalyst 31, resulting in gradual deterioration in etching performance. Thus, the conditioning of the catalyst 31 may be performed at a predetermined timing. In the above-described substrate processing apparatus 10, the head 30 is evacuated to the conditioner 60 so that the conditioning of the catalyst 31 can be performed. The predetermined timing can be set to be an interval period of the etching process (period from when a processed substrate WF is carried out of the table 20 to when an unprocessed substrate WF is placed on the table 20), every elapse of the predetermined operating period, or the like.

The embodiments of the present invention have been described above based on some examples in order to facilitate understanding of the present invention without limiting the present invention. The present invention can be changed or improved without departing from the gist thereof, and of course, the equivalents of the present invention are included in the present invention. It is possible to arbitrarily combine or omit respective components according to claims and description in a range in which at least a part of the above-described problems can be solved, or a range in which at least a part of the effects can be exhibited.

From the above-described embodiments, at least the following technical ideas are obtained.

[Configuration 1] According to a configuration 1, a method for processing a substrate is provided. The substrate is formed of an insulating film layer where a groove is formed, a barrier metal layer, and a wiring metal layer in order from a bottom in at least a part of a region. The method includes (1) while the wiring metal layer is exposed to a surface of the substrate, a step of removing the surface of the substrate, (2) while the wiring metal layer and the barrier metal layer are exposed to the surface of the substrate, a step of removing the surface of the substrate, and (3) while the wiring metal layer, the barrier metal layer, and the insulating film layer are exposed to the surface of the substrate: a step of bringing the surface of the substrate into contact with a catalyst; a step of supplying a process liquid between the catalyst and the surface of the substrate; and a step of applying a voltage or flowing a current between the catalyst and the surface of the substrate.

[Configuration 2] According to a configuration 2, the method according to the configuration 1 includes (2) while the wiring metal layer and the barrier metal layer are exposed to the surface of the substrate: a step of bringing the surface of the substrate into contact with a catalyst; a step of supplying a process liquid between the catalyst and the surface of the substrate; and a step of flowing a current between the catalyst and the surface of the substrate.

[Configuration 3] According to a configuration 3, the method according to the configuration 1 or the configuration 2 includes (1) while the wiring metal layer is exposed to the surface of the substrate, a step of bringing the surface of the substrate into contact with a catalyst; a step of supplying a process liquid between the catalyst and the surface of the substrate; and a step of flowing a current between the catalyst and the surface of the substrate.

[Configuration 4] According to a configuration 4, in the method according to the configuration 2, (2) at least one condition among conditions of the catalyst, the process liquid, and the current used in a process of the substrate while the wiring metal layer and the barrier metal layer are exposed to the surface of the substrate (3) is different from conditions of the catalyst, the process liquid, and the current used in the process of the substrate while the wiring metal layer, the barrier metal layer, and the insulating film layer are exposed to the surface of the substrate.

[Configuration 5] According to a configuration 5, in the method according to the configuration 3, (1) at least one condition among conditions of the catalyst, the process liquid, and the current used in a process of the substrate while the wiring metal layer is exposed to the surface of the substrate (3) is different from conditions of the catalyst, the process liquid, and the current used in a process of the substrate while the wiring metal layer, the barrier metal layer, and the insulating film layer are exposed to the surface of the substrate.

[Configuration 6] According to a configuration 6, in the method according to any one configuration of the configuration 1 to the configuration 5, the catalyst has at least one of groups formed of ruthenium (Ru), rhodium (Rh), palladium (Pd), argentum (Ag), iridium (Ir), platinum (Pt), and gold (Au).

[Configuration 7] According to a configuration 7, in the method according to any one configuration of the configuration 1 to the configuration 5, the catalyst has an alloy mainly composed of any one of groups formed of ruthenium (Ru), rhodium (Rh), palladium (Pd), argentum (Ag), iridium (Ir), platinum (Pt), and gold (Au).

[Configuration 8] According to a configuration 8, the method according to any one configuration of the configuration 1 to the configuration 7 includes a step of forming a catalyst on a surface of an elastic member by any one of methods including a sputter deposition method, a chemical vapor deposition method (CVD), a vapor deposition method, and a plating method.

[Configuration 9] According to a configuration 9, in the method according to any one configuration of the configuration 1 to the configuration 8, the barrier metal layer and the wiring metal layer contain at least one of ruthenium (Ru), cobalt (Co), copper (Cu), molybdenum (Mo), tantalum (Ta), and titanium nitride (TiN).

[Configuration 10] According to a configuration 10, in the method according to any one configuration of the configuration 1 to the configuration 9, the process liquid contains a liquid containing a compound having an oxidizing property and an electrolyte.

[Configuration 11] According to a configuration 11, in the method according to the configuration 10, the electrolyte contains at least one of hydrochloric acid, nitric acid, sulfuric acid, phosphoric acid, citric acid, oxalic acid, formic acid, acetic acid, potassium hydroxide, sodium hydroxide, calcium hydroxide, ammonia, potassium chloride, sodium chloride, and sodium sulfate.

[Configuration 12] According to a configuration 12, the method according to any one configuration of the configuration 1 to the configuration 11 includes a step of conditioning the catalyst.

[Configuration 13] According to a configuration 13, the method according to the configuration 12 includes a step of immersing the catalyst in a conditioning liquid.

[Configuration 14] According to a configuration 14, the method according to the configuration 13 includes a step of applying a voltage between the catalyst and an electrode for conditioning while the catalyst is immersed in the conditioning liquid.

REFERENCE SIGNS LIST

10 . . . substrate processing apparatus
20 . . . table
21 . . . wall
22 . . . electrode
25 . . . power source
30 . . . head
31 . . . catalyst
32 . . . base member
40 . . . nozzle
50 . . . arm
60 . . . conditioner
90 . . . controller
102 . . . insulating film layer
106 . . . barrier metal layer
108 . . . wiring metal layer
WF . . . substrate

What is claimed is:

1. A method for processing a substrate, wherein
the substrate includes an insulating film layer where a groove is formed, a barrier metal layer, and a wiring metal layer in order from a bottom in at least a part of a region, and the method comprises:
(1) while the wiring metal layer is exposed to a surface of the substrate, a step of removing the surface of the substrate,
(2) while the wiring metal layer and the barrier metal layer are exposed to the surface of the substrate, a step of removing the surface of the substrate, and
(3) while the wiring metal layer, the barrier metal layer, and the insulating film layer are exposed to the surface of the substrate:
a step of bringing the surface of the substrate into contact with a catalyst;
a step of supplying a process liquid between the catalyst and the surface of the substrate; and
a step of applying a voltage or flowing a current between the catalyst and the surface of the substrate.

2. The method according to claim 1, wherein
the catalyst has at least one of groups formed of ruthenium (Ru), rhodium (Rh), palladium (Pd), argentum (Ag), iridium (Ir), platinum (Pt), and gold (Au).

3. The method according to claim 1, wherein
the catalyst has an alloy mainly composed of any one of groups formed of ruthenium (Ru), rhodium (Rh), palladium (Pd), argentum (Ag), iridium (Ir), platinum (Pt), and gold (Au).

4. The method according to claim 1, comprising
a step of forming the catalyst on a surface of an elastic member by any one of methods including a sputter deposition method, a chemical vapor deposition method (CVD), a vapor deposition method, and a plating method.

5. The method according to claim 1, wherein
the barrier metal layer and the wiring metal layer contain at least one of ruthenium (Ru), cobalt (Co), copper (Cu), molybdenum (Mo), tantalum (Ta), and titanium nitride (TiN).

6. The method according to claim 1, comprising
(2) while the wiring metal layer and the barrier metal layer are exposed to the surface of the substrate:
a step of bringing the surface of the substrate into contact with the catalyst;
a step of supplying the process liquid between the catalyst and the surface of the substrate; and
a step of flowing a current between the catalyst and the surface of the substrate.

7. The method according to claim 6, wherein
at least one condition among conditions of the catalyst, the process liquid, and the current used in a process of the substrate while the wiring metal layer and the barrier metal layer are exposed to the surface of the substrate is different from conditions of the catalyst, the process liquid, and the current used in the process of the substrate while the wiring metal layer, the barrier metal layer, and the insulating film layer are exposed to the surface of the substrate.

8. The method according to claim 1, comprising
(1) while the wiring metal layer is exposed to the surface of the substrate,
a step of bringing the surface of the substrate into contact with the catalyst;
a step of supplying the process liquid between the catalyst and the surface of the substrate; and
a step of flowing a current between the catalyst and the surface of the substrate.

9. The method according to claim 8, wherein
at least one condition among conditions of the catalyst, the process liquid, and the current used in a process of the substrate while the wiring metal layer is exposed to the surface of the substrate is different from conditions of the catalyst, the process liquid, and the current used in a process of the substrate while the wiring metal layer, the barrier metal layer, and the insulating film layer are exposed to the surface of the substrate.

10. The method according to claim 1, wherein the process liquid contains a liquid containing a compound having an oxidizing property, and an electrolyte.

11. The method according to claim 10, wherein the electrolyte contains at least one of hydrochloric acid, nitric acid, sulfuric acid, phosphoric acid, citric acid, oxalic acid, formic acid, acetic acid, potassium hydroxide, sodium hydroxide, calcium hydroxide, ammonia, potassium chloride, sodium chloride, and sodium sulfate.

12. The method according to claim 1, comprising a step of conditioning the catalyst.

13. The method according to claim 12, comprising a step of immersing the catalyst in a conditioning liquid.

14. The method according to claim 13, comprising a step of applying a voltage between the catalyst and an electrode for conditioning while the catalyst is immersed in the conditioning liquid.

* * * * *